(12) United States Patent
Spreiter et al.

(10) Patent No.: US 7,606,019 B2
(45) Date of Patent: Oct. 20, 2009

(54) MAGNET COIL SYSTEM WITH ACTIVE DRIFT COMPENSATION FOR TWO INDEPENDENT CURRENT PATHS

(75) Inventors: Rolf Spreiter, Zurich (CH); Patrik Vonlanthen, Schwerzenbach (CH)

(73) Assignee: Bruker Biospin AG, Faellanden (CH)

( * ) Notice: Subject to any disclaimer, the term of this patent is extended or adjusted under 35 U.S.C. 154(b) by 76 days.

(21) Appl. No.: 12/068,038

(22) Filed: Feb. 1, 2008

(65) Prior Publication Data

US 2008/0191823 A1    Aug. 14, 2008

(30) Foreign Application Priority Data

Feb. 8, 2007    (DE)    ........................ 10 2007 006 324

(51) Int. Cl.
*H01F 6/00*    (2006.01)
(52) U.S. Cl. ........................ 361/141; 324/320; 335/216; 505/851
(58) Field of Classification Search ................. 335/216; 324/318–320; 361/19, 141; 505/850–851, 505/879
See application file for complete search history.

(56) References Cited

U.S. PATENT DOCUMENTS

| | | | |
|---|---|---|---|
| 3,522,512 A | 8/1970 | Buchhold | |
| 3,568,002 A * | 3/1971 | Robins et al. | ............... 361/141 |
| 6,946,936 B2 | 9/2005 | Schauwecker | |
| 7,068,133 B2 | 6/2006 | Ries | |
| 2006/0066429 A1 | 3/2006 | Kasten | |
| 2006/0103385 A1 | 5/2006 | Shen | |

FOREIGN PATENT DOCUMENTS

GB    1 068 372    5/1967

OTHER PUBLICATIONS

Van De Klundert L. et al. "Fully superconducting rectifiers and fluxpumps Part 1: Realized methods for pumping flux", Cryogenics, Elsevier, Kidlington, GB vol. 21, No. 4, Apr. 1, 1981, Pa. 195-206.

* cited by examiner

*Primary Examiner*—Ramon M Barrera
(74) *Attorney, Agent, or Firm*—Paul Vincent

(57) ABSTRACT

A magnet coil system (2) which is at least partially superconducting at a cryogenic temperature, comprising at least two partial coils (3, 4, 5) which are connected in series and are each bridged by a superconducting switch (6, 7, 8), such that the partial coils form independent electric loops (11, 12, 13) when the superconducting switches (6, 7, 8) are closed, is characterized in that two electric loops (11, 12) have a common section and a flux pump (10) is provided which is circuited in the common section (14) of the electric loops (11, 12) of two partial coils (3, 4), wherein the sum of the currents of the two partial coils (3, 4) flows through the flux pump (10) in the operating state. In this fashion, the drifts of two independent electric loops can be compensated for with a few devices.

12 Claims, 2 Drawing Sheets

MAGNET COIL SYSTEM WITH ACTIVE DRIFT COMPENSATION FOR TWO INDEPENDENT CURRENT PATHS

This application claims Paris Convention priority of DE 10 2007 006 324.7 filed Feb. 8, 2007 the complete disclosure of which is hereby incorporated by reference.

BACKGROUND OF THE INVENTION

The invention concerns a magnet coil system that is at least partially superconducting at a cryogenic temperature, comprising at least two serially connected partial coils which are each bridged by a superconducting switch, such that the partial coils form independent current loops when the superconducting switches are closed.

A magnet coil system of this type is disclosed in US 2006/0066429 A1.

By connecting several superconducting coils in series, wherein each coil is bridged by a superconducting switch, the coils can be sequentially charged with individual currents via one single current source and one single pair of current supply lines. When the coils are magnetically decoupled from each other, each coil can be directly charged with its current. This principle is normally used for charging shim coils which are designed such that they do not couple with each other. If this is not the case, the couplings must be taken into consideration, and a charging sequence must be observed.

The same principle is also used for charging partial coils of a magnet system with different currents. This is of particular interest when a magnet system comprises partial coils of conventional superconductors (LTS) and of high-temperature superconductors (HTS). Use of different currents in the various partial coils yields additional degrees of freedom for the system design. Since the available dimensions for HTS are limited, one is dependent to these degrees of freedom for designing an optimum system.

US2006/066429A1 utilizes two electric loops in order to obtain one pure HTS and one pure LTS electric loop. This avoids problematic superconducting connections between HTS and LTS, and a system with little drift can be realized. The technology for superconducting connections between similar conductors exists. Moreover, the above-mentioned additional degrees of freedom for the design can also be realized by using two electric loops.

In particular, when an HTS is used for superconducting magnet systems that are used e.g. for high-resolution nuclear magnetic resonance experiments, compensation of a slow current loss (field drift) is required. When an HTS coil is connected in series with an LTS coil, the connections between HTS and LTS (HTS-LTS joints) are often problematic and produce a field drift. If the HTS coil has its own current path, the inductance is typically very small. Even minor problems with wires or superconducting connections produce a large field drift, in particular, since the HTS coil substantially contributes to the field. An HTS often has a smaller so-called n-value compared to an LTS. The n-value describes the behavior of the resistance R of a superconductor in dependence on the current I that flows through the superconductor, which will be explained below. The smaller n-value of HTS means that a load will result in a higher field drift that must be compensated for.

Drift compensation with LTS coils may also be desirable. The current load on the wires can be increased, wherein, in turn, more compact and less expensive systems can be realized. Moreover, expensive repair work can be avoided in case of imperfect superconducting connections or damaged wires.

The suitable means for such drift compensation is a flux pump. Drift compensation using flux pumps is currently the only possibility of compensating the drift in the "persistent mode" on a long-term and continuous basis, i.e. without having to permanently guide the magnetic current into the cryostat, which would be the case for operating a magnet coil system in the "driven mode".

It is also desirable to use two independent electric loops in order to obtain additional degrees of freedom for the design. Utilization of the superconductors is thereby improved and consequently, more compact and less expensive systems can finally be realized. In particular, HTS are only available in a few dimensions, and the degrees of freedom of different currents and different coil sections are required to obtain an effective design.

If both two independent electric loops as well as drift compensation are required, each electric circuit could be provided with one flux pump. This involves great expense, requires a large amount of space in the cryostat and is also susceptible to failure due to the increased complexity. Both flux pumps would then have to be controlled and field control would be complex. In particular, it would be difficult to determine which partial coil produces which part of the field loss. This determination is, however, necessary in order to correctly control the performance of both flux pumps and keep the individual currents constant. The use of two flux pumps would, however, most likely result in uncontrolled current shifts from one electric circuit to the other. In order to prevent this, the currents of the partial coils would have to be measured, which is relatively demanding, e.g. using Hall probes inside a measuring winding slightly outside of the magnet. It is, however, doubtful whether this measurement is sufficiently precise. In total, this possibility of drift compensation does not seem to be practicable.

It is therefore the underlying purpose of the invention to propose a magnet coil system comprising two independent electric circuits, wherein effective drift compensation can be performed in a simple manner.

SUMMARY OF THE INVENTION

This object is achieved in accordance with the invention in that two electric circuits comprise one common section, and one flux pump is provided which is circuited in the common section of the electric circuits of the two partial coils, wherein the total current of the two partial coils flows through the flux pump in the operating state.

The inventive magnet coil system thus utilizes only one single supply (flux pump) which can simultaneously support two electric loops with different currents. The flux pump is connected to the superconducting current path in such a fashion that the sum of the currents of the two partial coils flows through it, wherein the supply compensates for a voltage drop generated in these partial coils. In this fashion, the drift of two independent electric loops can be compensated for with a few devices.

The invention is particularly advantageous when one or more of the partial coils consist at least in part of high-temperature superconducting material, since the technology for superconducting wire connections of HTS coils is still problematic, and for this reason, the field drift is generally higher.

The inventive magnet coil system is preferably used in an NMR, MRI, EPR, or FTMS spectrometers.

The currents in the two energized partial coils are adjusted relative to each other such that the voltage loss in both partial coils is the same. When the voltage is kept constant, the currents are adjusted in such a fashion that the superconductor of both partial coils is identically loaded. If the critical current in one coil is e.g. higher than assumed in the design, this wire will carry a higher current and the load on the other will be slightly reduced. The system thus has an inherent self-regulation mechanism which uniformly distributes the load in the two current paths. One certain disadvantage of this principle consists in that the resulting current distribution is not exactly known beforehand. It depends on the effective critical currents, the n-factors of the superconductors, and on generated defects or resistive wire connections.

Since the current distribution still slowly changes in the operating state, each coil part of the individual electric circuits must have a certain basic homogeneity in the generated field, such that the overall homogeneity is still sufficiently good after the current redistributions, and the overall gradients do not change excessively rapidly during the current redistributions. In one particularly preferred embodiment of the inventive magnet coil system, the two partial coils in the sample volume generate a sufficiently homogeneous partial magnetic field, such that a magnetic field is generated in the sample volume, which is sufficiently homogeneous for the application, despite a current redistribution within the partial coils caused by the supply, wherein, in particular, the H2 field gradient of the corresponding partial magnetic field is smaller than 0.1 Gauss/(cm$^2$A).

The H2 gradient is the coefficient of the term of 2nd degree and zero order of the expansion of the magnetic field profile in spherical harmonics in cylindrical coordinates and describes the part of the field profile along the magnet axis z that is proportional to $z^2$.

When the magnetic field of a magnet must be homogenized, which is required e.g. for NMR, MRI, EPR, and FTMS applications, the H2 gradient of the magnet must firstly be minimized. This can be achieved e.g. by combining partial coils with positive and negative H2 gradients. A deviation of the currents from the value for which the partial coils are designed can impair the overall homogeneity to such an extent that the system becomes useless.

When the H2 gradient of the corresponding partial magnetic field of a partial coil is smaller than 0.1 Gauss/(cm$^2$A) as described above, the H2 gradient of the overall system can be corrected with room temperature shims. An assumed typical current difference of 10 A results in a H2 gradient of at most 1 Gauss/cm$^2$, which corresponds approximately to half the maximum possible current in a typical room temperature shim system for the Z2 shim. The H2 gradient of a partial coil can e.g. be reduced by using a notch structure in the winding packet. Towards this end, the current density in one area in the center of the winding packet can be reduced by providing less current-carrying windings or none at all in this area.

One or more of the partial coils are advantageously largely inductively decoupled from the other partial coils. Loading with the external current source is facilitated, since the partial coils can be successively charged with the corresponding current without excessively influencing the currents in the other partial coils. On the other hand, in case of a quench of one partial coil without decoupling, dangerously high currents could inductively build up in other partial coils, which could even destroy these partial coils.

The inductance of the magnet coil system, which consists of several partial coils, can be described by a symmetrical inductance matrix $L_{ij}$, wherein the diagonal elements of the matrix correspond to the self inductances of the partial coils and the non-diagonal elements describe the coupling between two partial coils. The coupling between two partial coils is small when the corresponding non-diagonal element is smaller by at least a factor of 5 than the corresponding diagonal elements: $L_{kk} \geq 5 \cdot L_{ki}$ for all i, with i≠k. The partial coils are then called "inductively decoupled".

In one special embodiment of the inventive magnet coil system, one or more of the partial coils is/are divided into subsections which are connected in series.

In one advantageous further development of this embodiment, the subsections are at least partially disposed at different radii. The distribution of subsections of a partial coil at different radii can be used to reduce the H2 gradient of a partial coil by positioning the subsections in such a fashion that the H2 gradients of the coil sections partially compensate each other.

In one particularly preferred embodiment, the subsections are at least partially oppositely polarized and then act as active shielding of the stray field.

The invention also concerns a magnet configuration with an inventive magnet coil system which is disposed in a cryostat with at least one cryogenic chamber, wherein one common power supply can be connected for the partial coils, which successively loads the partial coils with different currents via two common feed lines.

In one preferred embodiment of this magnet configuration, the flux pump is disposed in the same cryogenic chamber as the magnet coil system.

The invention also comprises a method for operating an inventive magnet coil system, wherein the electric circuits are connected to an external charging device for loading the partial coils, and the operating currents of the electric circuits that contain the flux pump are selected such that these two electric currents change their operating currents by at most 10% after removal of the external charging device and switching on of the flux pump, until the stationary state is obtained.

Further advantages of the invention can be extracted from the description and the drawing. The features mentioned above and below may be used individually or collectively in arbitrary combinations. The embodiments shown and described are not to be understood as exhaustive enumeration but have exemplary character for describing the invention.

DESCRIPTION OF THE PREFERRED EMBODIMENT

Figure 1:
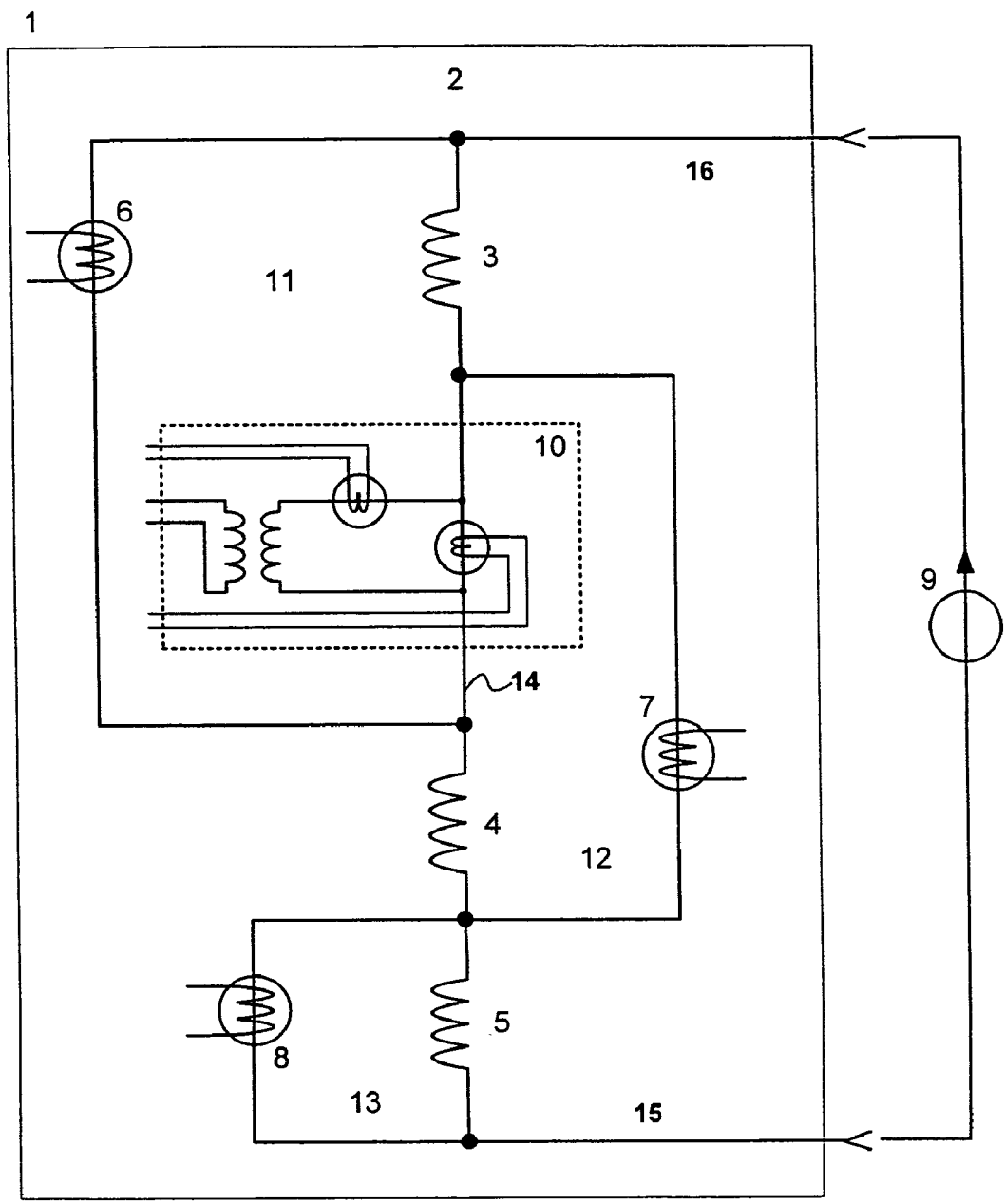
FIG. 1 shows a circuit diagram of an inventive magnet coil system with drift compensation.

FIG. 1 shows an inventive magnet coil system 2 that is disposed in a cryogenic chamber 1. The magnet coil system 2 comprises three superconducting partial coils 3, 4, 5 which are connected in series. Each partial coil 3, 4, 5 is bridged with a superconducting switch 6, 7, 8. The partial coils 3, 4, 5 form independent electric loops 11, 12, 13 when the superconducting switches 6, 7, 8 are closed. The magnet coil system 2 is at least partially superconducting, i.e. it may comprise resistive parts which result in a drift. These resistive parts may occur e.g. when the superconducting partial coils are operated close to their critical current. It is, however, also possible that the joints used in the magnet coil system 2 are defective or resistively soldered, and therefore cause a drift.

A power supply 9 is connected to the magnet coil system 2 via a pair of current supply lines 15, 16 for charging the magnet coil system 2. The charging process of the partial coils bridged by the respectively closed switches can be interrupted by closing one or more of the superconducting switches 6, 7, 8, while the charging process of the partial coils, whose switches are not closed, can be continued. In this fashion, the partial coils 3, 4, 5 can be charged to different operating currents. This is also possible with the conventional magnet coil system 2' shown in FIG. 2.

Figure 2:
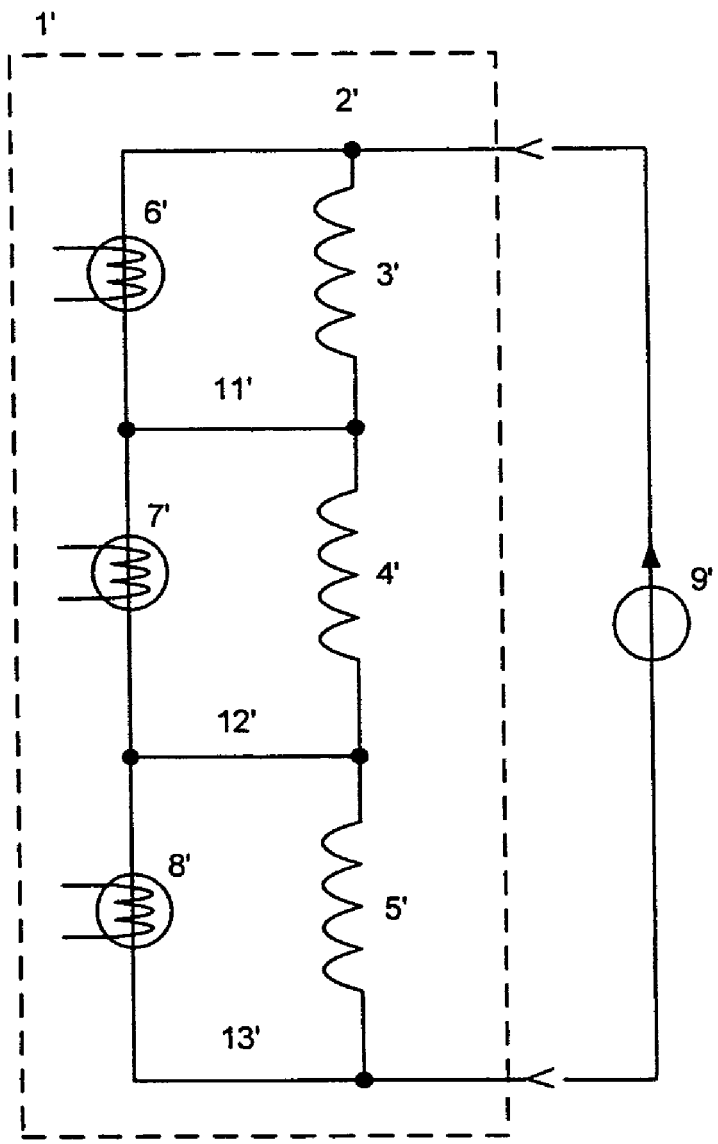
FIG. 2 shows a circuit diagram of a magnet coil system in accordance with prior art without drift compensation.

In contrast to the conventional magnet coil system 2' shown in FIG. 2, the partial coils 3, 4, 5 of the inventive magnet coil system 2 are bridged such that the electric circuits 11, 12 of the partial coils 3, 4, have a common section 14. The partial coils 3, 4, 5 may be HTS or LTS coils. One of the two partial coils 3, 4, whose electric circuits 11, 12 have the common section 14, are preferably produced from HTS material, while the other partial coil is an LTS coil.

A flux pump 10 is provided in the common section 14, which feeds both the partial coil 3 and the partial coil 4. In this fashion, one single flux pump 10 supplies two partial coils, thereby simultaneously and effectively compensating for the drift of two partial coils in the magnet coil system, wherein the partial coils can be operated with different currents. FIG. 1 shows a special construction of a flux pump 10. Other embodiments of flux pumps may also be used.

The inventive magnet coil system can therefore also be used with imperfect HTS-LTS, LTS-LTS or HTS-HTS joints without the risk that an excessive drift renders the magnet system unusable.

For stabilizing the field of the overall system, only the voltage of the supply is controlled. For a typical flux pump, this voltage is very small and lies within a range of 0 . . . 0.1 mV. One of the partial coils 3, 4 typically has a much smaller inductance than the other partial coil, since e.g. a partial coil with HTS is only used for the innermost part of the magnet coil system 2 and thus has a smaller inductance. If such a system of large and small inductances is controlled via a common voltage, the partial coil with the small inductance will always react first in order to maintain the desired field, followed by current redistributions with large time constants until the equilibrium state is reached. A coil with small inductance is advantageous, since the system reacts faster compared to operation of the flux pump over the entire magnet. Control of the field is thereby improved.

When the partial coils 3, 4 are charged, the currents in the partial coils 3, 4 are adjusted such that the two electric circuits 11, 12 that contain the partial coils 3, 4 require the same voltage in order to maintain constant currents. The system actually has a self-regulating mechanism, wherein the currents in the independent electric circuits basically adjust themselves, such that the voltage loss in both partial coils is the same. This current redistribution occurs on a time scale of months or years, such that one first rough adjustment of the required currents is necessary during charging, which is described below:

A physical superconductor has a residual resistance which increases the closer one approaches the critical current $I_c$. The voltage drop per meter of conductor length can be approximated with the following equation:

$$U = 10\frac{\mu V}{m} \cdot L \cdot (I/I_c)^n$$

wherein the critical current $I_c$ is defined such that with a current $I=I_c$ the voltage drops by 10 μV per meter of conductor length. L is the length of the conductor and the exponent n is called the n-factor and has a value of the order of magnitude of 20 to 40 for common superconductor materials. Since the critical current $I_c$ and the n-factor are functions of the magnetic field strength, and this field strength depends on the location in the coil, integration over the conductor length is required. The total voltage drop of a coil then yields:

$$U_t = 10\frac{\mu V}{m} \int_0^L (I/I_c(x))^{n(x)} dx$$

When a certain desired field $B_{tot}$ shall be obtained with two partial coils, wherein both partial coils shall have the same voltage drop, the following two equations must be satisfied:

$$\int_0^{L_1} (I_1/I_{c1}(x))^{n1(x)} dx = \int_0^{L_2} (I_2/I_{c2}(x))^{n2(x)} dx,$$

and $$A_1 I_1 + A_2 I_2 = B_{tot},$$

wherein $A_1$ and $A_2$ are the generated field strengths in the sample volume per ampere current of the respective partial coil. The required operating currents $I_1$ and $I_2$ of the partial coils can then be numerically determined from the above two equations. Clearly, the currents cannot thereby be exactly determined, since the material properties of the superconductor are not exactly known.

The deviation of the currents from the ideal value of the above formulas results in deviations in homogeneity, since each partial coil alone has a worse homogeneity than the entire magnet coil system, in particular, the H2 gradient. The system must be dimensioned such that this deviation can either be tolerated or be corrected by a room temperature shim system that is typically used for NMR spectrometers. When one of these criteria is met, the magnetic field in the sample volume is regarded as sufficiently homogeneous. The deviation from the ideal current distribution may change the H2 gradient by at most 1 Gauss/cm², such that the above-mentioned criterion is met. The partial coils are suitably designed such that the field gradient of the partial coils is smaller than 0.1 Gauss/(cm² A). In this case, a current deviation of 10 A after charging can be tolerated, since the H2 gradient caused thereby can be compensated for with approximately half the maximum current of a typical room temperature shim system, such that a sufficiently exact initial charging state can be easily and reliably reached in practice. One condition for this is that the material parameters of the superconductors are relatively well known which is, however, no problem with modern measuring methods.

The behavior or the inventive configuration is explained by means of one exemplary model. Simulation was performed with the Software Simplorer Version 7.0. The model system consists of the two partial coils 3 and 4 with different operating currents and the common flux pump 10. The partial coil 3 is produced from HTS, while the partial coil 4 is wound from conventional superconductor (LTS). The following parameters were used for the partial coils:

|  | Partial coil 3 (HTS) | Partial coil 4 (LTS) |
|---|---|---|
| Inductance | 1 H | 140 H |
| Operating current | 119.836 A | 244.968 A |
| Index n | 20 | 40 |

-continued

|  | Partial coil 3 (HTS) | Partial coil 4 (LTS) |
|---|---|---|
| Ic | 170 A | 350 A |
| Resistance $R_s$ at Ic | 0.1 mΩ | 2 mΩ |
| Generated field per A | 0.9 MHz/A | 2.418 MHz/A |

In order to simplify the simulation, an integrated form of the current voltage relation was used. This is naturally only an approximation, but qualitatively describes the coil behavior.

$$U = R_s \cdot (I/I_c)^n.$$

It is assumed that the two coils are decoupled from each other, and the flux pump generates a constant support voltage of 11 µV. The parameters were selected such that the system remains stationary, i.e. the voltage loss due to the finite n-value is compensated for both partial coils by the voltage generated by the flux pump. The resulting overall field then corresponds to an NMR proton frequency of 700.186 MHz.

We now assume that the superconductor of the HTS coil has a critical current Ic which is 10 A above the value used for the calculation, i.e. Ic=180 A. The HTS coil is then charged to 126.55 A within 13 days and the resulting field increases to 706.225 MHz. The support voltage must therefore be reduced to 4 µV, such that the LTS coil remains stationary and the desired field is maintained in this case. This is followed by a balancing process between the two partial coils, which is very slow and can take years. The LTS coil is discharged very slowly, and the support voltage must be successively increased again to 8.5 µV until a new stationary state has been reached. The currents are then newly distributed and the new value is 125.0 A for the HTS and 242.97 A for the LTS. The HTS coil whose conductor is better than expected must carry an additional current of approximately 5.2 A. In this case, the load on the LTS coil is reduced by 2 A.

The example shows that deviations of the material parameters from the values used for the design cause a current redistribution between the partial coils. These current redistributions are very sluggish and remain unnoticed by the user of the system.

| List of Reference Numerals | |
|---|---|
| 1,1' | cryogenic chamber |
| 2,2' | magnet coil system |
| 3,3' | partial coil |
| 4,4' | partial coil |
| 6,6' | superconducting switch |
| 7,7' | superconducting switch |
| 8,8' | superconducting switch |
| 9,9' | power supply |
| 10 | flux pump |
| 11,11' | electric circuit |
| 12,12' | electric circuit |
| 13,13' | electric circuit |
| 14 | common section of electric circuits 11 and 12 |

We claim:

1. A magnet coil system which is at least partially superconducting at a cryogenic temperature, the magnet system comprising:
a first partial coil;
at least one second partial coil which is connected in series with said first partial coil;
a first superconducting switch bridging said first partial coil, said first partial coil and said first superconducting switch forming a first independent electric loop when said first superconducting switch is closed;
a second superconducting switch bridging said second partial coil, said second partial coil and said second superconducting switch forming a second independent electric loop when said second superconducting switch is closed, wherein said first and said second electric loop have a common section; and
a flux pump circuited in said common section, wherein a total sum of currents of said first and said second partial coils flows through said flux pump in an operating state.

2. The magnet coil system of claim 1, wherein at least one of said first and said second partial coils at least partially consists of high-temperature superconducting material.

3. The magnet coil system of claim 1, wherein the magnet coil system is structured and dimensioned for an NMR, MRI, EPR or FTMS spectrometer.

4. The magnet coil system of claim 3, wherein said first and said second partial coils generate a sufficiently homogeneous partial magnetic field in the sample volume, such that a magnetic field is generated in the sample volume, which is sufficiently homogeneous for a respective application, despite current redistribution within said first and said second partial coils caused by said flux pump.

5. The magnet coil system of claim 4, wherein an H2 field gradient of a corresponding partial magnetic field is smaller than 0.1 Gauss/(cm²A).

6. The magnet coil system of claim 1, wherein at least said first and said second partial coils is substantially inductively decoupled from other partial coils.

7. The magnet coil system of claim 1, wherein at least one of said first and said second partial coils are divided into subsections which are connected in series.

8. The magnet coil system of claim 7, wherein said subsections are at least partially arranged on different radii.

9. The magnet coil system of claim 7, wherein said subsections are at least partially oppositely polarized to act as active shielding of a stray field.

10. The magnet configuration comprising the magnet coil system of claim 1, disposed in a cryostat having at least one cryogenic chamber, wherein a common power supply for said first and said second partial coils successively loads said first and said second coils with different currents via two common supply lines.

11. The magnet configuration of claim 10, wherein said flux pump is disposed in a same cryogenic chamber as the magnet coil system.

12. A method of operating the magnet coil system of claim 1, wherein said first and said second electric loops are connected to an external charging device for charging said first and said second partial coils, wherein operating currents of electric loops which contain said flux pump are selected such that those operating currents change by maximally 10% after removing the external charging device and switching on said flux pump, until a stationary state is reached.

* * * * *